(12) United States Patent
Nguyen et al.

(10) Patent No.: US 7,911,296 B2
(45) Date of Patent: Mar. 22, 2011

(54) RESONATOR SYSTEM SUCH AS A MICRORESONATOR SYSTEM AND METHOD OF MAKING SAME

(75) Inventors: Clark T. C. Nguyen, Berkley, CA (US); Yu-Wei Lin, Irvine, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 320 days.

(21) Appl. No.: 12/135,388

(22) Filed: Jun. 9, 2008

(65) Prior Publication Data
US 2009/0009269 A1 Jan. 8, 2009

Related U.S. Application Data

(60) Provisional application No. 60/934,143, filed on Jun. 8, 2007.

(51) Int. Cl.
*H03H 9/50* (2006.01)
(52) U.S. Cl. .......................... 333/186; 333/199; 333/187
(58) Field of Classification Search .................. 333/186, 333/199, 197, 187
See application file for complete search history.

(56) References Cited

U.S. PATENT DOCUMENTS

| | | | |
|---|---|---|---|
| 6,856,217 B1 | 2/2005 | Clark et al. | |
| 6,985,051 B2 | 1/2006 | Nguyen et al. | |
| 7,098,757 B2 * | 8/2006 | Avazi et al. | 333/186 |
| 7,119,636 B2 | 10/2006 | Nguyen et al. | |
| 7,295,088 B2 | 11/2007 | Nguyen et al. | |
| 7,436,271 B2 * | 10/2008 | Weinstein et al. | 333/186 |
| 7,696,843 B2 * | 4/2010 | Hashimura | 333/186 |
| 2005/0206479 A1 | 9/2005 | Nguyen et al. | |
| 2006/0273867 A1 | 12/2006 | Piazza et al. | |
| 2006/0290449 A1 | 12/2006 | Piazza et al. | |
| 2007/0046398 A1 | 3/2007 | Nguyen et al. | |

OTHER PUBLICATIONS

Lin, Yu-Wei, et al., Low Phase Noise Array-Composite Micromechanical Wine-Glass Disk Oscillator, Technical Digest, IEDM, Washington, D.C., Dec. 2005, pp. 287-290.
Wang, J., et al., 1.51-GHz Polydiamond Micromechanical Disk Resonator With Impedance-Mismatched Isolating Support, Proceedings, MEMS, Maastricht, The Netherlands, Jan. 2004, pp. 641-644.

(Continued)

*Primary Examiner* — Benny Lee
*Assistant Examiner* — Alan Wong
(74) *Attorney, Agent, or Firm* — Brooks Kushman P.C.

(57) ABSTRACT

A resonator system such as a microresonator system and a method of making same are provided. In at least one embodiment, a mechanical circuit-based approach for boosting the Q of a vibrating micromechanical resonator is disclosed. A low Q resonator is embedded into a mechanically-coupled array of much higher Q resonators to raise the functional Q of the composite resonator by a factor approximately equal to the number of resonators in the array. The availability of such a circuit-based Q-enhancement technique has far reaching implications, especially considering the possibility of raising the functional Q of a piezoelectric resonator by merely mechanically coupling it to an array of much higher Q capacitively-transduced ones to simultaneously obtain the most attractive characteristics of both technologies: low impedance from the piezo-device and high-Q from the capacitive ones. Furthermore, the manufacturing repeatability of such micromechanical resonator-based products is enhanced.

26 Claims, 8 Drawing Sheets

OTHER PUBLICATIONS

Demirci, M., et al., Mechanically Corner-Coupled Square Microresonator Array For Reduced Series Motional Resistance, IEEE/ASME J. Microelectromech. System, Dec. 2006, vol. 15, No. 6, pp. 1419-1436.

Piazza, G., et al., Piezoelectric Aluminum Nitride Vibrating Contour-Mode MEMS Resonators, IEEE/ASME J. Microelectromech. System, Dec. 2006, vol. 15, No. 6, pp. 1406-1418.

Lin, Yu-Wei, et al., Series-Resonant VHF Micromechanical Resonator Reference Oscillators, IEEE Journal of Solid-State Circuits, Dec. 2004, vol. 39, No. 12, pp. 2477-2491.

Wang, J., et al., 1.156-GHz Self-Asigned Vibrating Micromechanical Disk Resonator, IEEE Trans. Ultrason, Ferroelectr., Freq. Control, Dec. 2004, vol. 51, No. 12, pp. 1607-1628.

Piazza, G., et al., Low Motional Resistance Ring-Shaped Contour-Mode Aluminum Nitride Piezoelectric Micromechanical Resonators For UHF Applications, Tech. Dig., 18th IEEE Int. Conf. on MEMS, Miami Beach, Florida, Jan. 30-Feb. 3, 2005, pp. 20-23.

Bannon, III, F.D., et al., High Frequency Micromechanical Filters, IEEE J. Solid-State Circuits, Apr. 2000, vol. 35, No. 4, pp. 512-526.

Li, S.-S., et al., Micromechanical Hollow-Disk Ring Resonators, Proceedings, 17th Int. IEEE MEMS Conf., Maastricht, The Netherlands, Jan. 25-29, 2004, pp. 821-824.

Li, S.-S., et al., Small Percent Bandwidth Design of a 431-MHZ Notch-Coupled Micromechanical Hollow-Disk Ring Mixer-Filter, Proceedings, IEEE Int. Ultrasonics Symposium, Sep. 18-21, 2005, pp. 1295-1298.

Pourkamali, Siavash, et al., Electrically coupled MEMS Bandpass Filters Part I: With Coupling Element, Sensors and Actuators A 122, 2005, pp. 307-316.

International Search Report and Written Opinion dated Oct. 2, 2008 for the corresponding PCT Serial No. US08/066276 Filed Jun. 9, 2008.

* cited by examiner

4 Narrow (1μm-Width) Support Beams

4 Wide (3μm-Width) Support Beams Plus Center Support

RESONATOR SYSTEM SUCH AS A MICRORESONATOR SYSTEM AND METHOD OF MAKING SAME

CROSS-REFERENCE TO RELATED APPLICATION

This application claims the benefit of U.S. provisional application Ser. No. 60/934,143 filed Jun. 8, 2007 and entitled "Quality Factor Boosting Via Mechanically-Coupled Arraying."

STATEMENT REGARDING FEDERALLY SPONSORED RESEARCH OR DEVELOPMENT

This invention was made with government support under Grant No. 66001-05-1-8907 awarded by Navy/SPAWAR. The government has certain rights in the invention.

BACKGROUND OF THE INVENTION

1. Field of the Invention

This invention related to resonator systems such as microresonator systems and methods of making same.

2. Background Art

The following references are referenced herein:

[1] Y.-W. Lin, et al., "Low phase noise array-composite micromechanical wine-glass disk oscillator," *Technical Digest*, IEDM, Washington, D.C., December 2005, pp. 287-290.

[2] J. Wang, et al., "1.51-GHz polydiamond micromechanical disk resonator with impedance-mismatched isolating support," *Proceedings*, MEMS, Maastricht, The Netherlands, January 2004, pp. 641-644.

[3] M. Demirci and C. T.-C. Nguyen, "Mechanically corner-coupled square microresonator array for reduced series motional resistance," *IEEE/ASME J. Microelectromech. Syst.*, vol. 15, no. 6, pp. 1419-1436, December 2006.

[4] G. Piazza, et al., "Piezoelectric aluminum nitride vibrating contour-mode MEMS resonators," *IEEE/ASME J. Microelectromech. Syst.*, vol. 15, no. 6, pp. 1406-1418, December 2006.

[5] Y.-W. Lin, et al., "Series-resonant VHF micromechanical resonator reference oscillators," *IEEE Journal of Solid-State Circuits*, vol. 39, no. 12, pp. 2477-2491, December 2004.

[6] J. Wang, et al., "1.156-GHz self-aligned vibrating micromechanical disk resonator," *IEEE Trans. Ultrason, Ferroelectr., Freq. Control*, vol. 51, no. 12, pp. 1607-1628, December 2004.

[7] G. Piazza, P. J. Stephanou, J. M. Porter, M. B. J. Wijesundara, and A. P. Pisano, "Low motional resistance ring-shaped contour-mode aluminum nitride piezoelectric micromechanical resonators for UHF applications," *Tech. Dig.*, 18th IEEE Int. Conf. on MEMS, Miami Beach, Fla., Jan. 30-Feb. 3, 2005, pp. 20-23.

[8] F. D. Bannon III, J. R. Clark, and C. T.-C. Nguyen, "High frequency micromechanical filters," *IEEE J. Solid-State Circuits*, vol. 35, no. 4, pp. 512-526, April 2000.

[9] S.-S. Li, Y.-W. Lin, Y. Xie, Z. Ren, and Clark T.-C. Nguyen, "Micromechanical hollow-disk ring resonators," *Proceedings*, 17th Int. IEEE MEMS Conf., Maastricht, Netherlands, Jan. 25-29, 2004, pp. 821-824.

[10] S.-S. Li, Y.-W. Lin, Y. Xie, Z. Ren, and C. T.-C. Nguyen, "Small percent bandwidth design of a 431-MHZ notch-coupled micromechanical hollow-disk ring mixer-filter," *Proceedings*, IEEE Int. Ultrasonics Symposium, Sep. 18-21, 2005, 1295-1298.

Recently, capacitively-driven vibrating micromechanical resonators have been demonstrated with resonance frequencies in the VHF range with Q's larger than 160,000 [1] and in the GHz range with Q's still larger than 11,000 [2], making them very attractive as on-chip frequency selecting elements for oscillators and filters in wireless communications. To date, oscillators comprised of several mechanically-coupled resonators [3] combined with sustaining transistor circuits have been demonstrated with phase noise performance commensurate with GSM cellular phone specifications for reference oscillators [1]. These oscillators owe their performance largely to the sheer Q of their constituent resonators. However, there are other applications, such as filters, where both high Q and low impedance are desirable.

Unfortunately, these two qualities have so far not been readily available simultaneously in any single CAD-definable micromechanical resonator design. So far, only capacitively-transduced resonators have achieved Q's over 50,000 at UHF frequencies [2], but with high impedance. On the other hand, piezoelectric resonators with CAD-defined frequencies have achieved impedances below 100$\Omega$, but only with Q's in the single-digit thousands [4]. A method for combining the most attractive individual characteristics of these devices to simultaneously obtain low impedance from the piezo-device and high-Q from the capacitive ones is highly desirable.

The following U.S. patent references are related to this invention: U.S. Pat. Nos. 6,856,217; 6,985,051; 7,119,636; 7,295,088; 2006/0290449; 2006/0273867; and 2007/0046398.

SUMMARY OF THE INVENTION

An object of the invention is to provide an improved resonator system such as a microresonator system and method of making same.

In carrying out the above object and other objects of the present invention, a method of making a resonator system is provided. The method includes the steps of providing a substrate and providing an array of resonators on the substrate. The resonators include a first resonator having a Q and at least one resonator having a Q different than the Q of the first resonator. The method further includes coupling the array of resonators together to form a composite resonator on the substrate having an effective Q different than the Q of the first resonator.

The effective Q may be greater than the Q of the first resonator by a factor approximately equal to the number of resonators in the array.

The step of coupling may be performed mechanically.

The first resonator may have a relatively low motional impedance and the composite resonator may have an effective motional impedance substantially equal to the low motional impedance.

The system may be a microresonator system wherein each of the resonators is a micromechanical resonator.

The first resonator may be a low-Q resonator and the at least one resonator may be at least one high-Q resonator having a Q greater than the Q of the low-Q resonator and the effective Q may be greater than the Q of the low-Q resonator.

The first resonator may be a high-Q resonator and the at least one resonator may be at least one low-Q resonator having a Q lower than the Q of the high-Q resonator and wherein the effective Q may be less than the Q of the high-Q resonator.

Further in carrying out the above object and other objects of the present invention, a resonator system is provided. The resonator system includes a substrate and an array of resonators disposed on the substrate. The resonators include a low-Q resonator and at least one high-Q resonator having a Q higher than a Q of the low-Q resonator. The array of resonators are coupled together to form a composite resonator on the substrate having an effective Q greater than the Q of the low-Q resonator.

The low-Q resonator may have a relatively low motional impedance and the composite resonator may have an effective motional impedance substantially equal to the low motional impedance.

The array of resonators may be mechanically coupled together.

The low-Q resonator may include a piezoelectric resonator having a relatively low motional impedance.

The at least one high-Q resonator may be operable in a wine-glass mode.

The at least one high-Q resonator may be a disk resonator.

The system may further include at least one coupling beam for mechanically coupling adjacent resonators together.

The system may still further include a support structure for supporting each of the resonators in the array above the substrate and the Q of each of the resonators in the array may be based on its respective support structure.

The at least one high-Q resonator may be a capacitively-transduced resonator.

All of the resonators in the array may be capacitively or piezoelectrically-transduced resonators.

All of the resonators in the array may be disk resonators.

All of the resonators in the array may be operable in a wine-glass mode.

The low-Q resonator may include an electrode and the at least one high-Q resonator may not have any electrodes.

The low-Q resonator may have a relatively high velocity point and the at least one high-Q resonator may have a relatively low velocity point. The at least one coupling beam may be mechanically coupled to the at least one high-Q resonator and the low-Q resonator at the low and high velocity points, respectively.

The low-Q resonator may be operable in a fundamental mode and the at least one high-Q resonator may be operable in a mode higher than the fundamental mode.

All of the resonators in the array may have substantially the same mass and the same stiffness.

The low-Q resonator may have a lower mass and a lower stiffness than the mass and the stiffness, respectively, of the at least one high-Q resonator.

All of the resonators in the array may be operable in a radial mode.

Each of the resonators may be mechanical resonators such as micromechanical resonators.

Still further in carrying out the above object and other objects of the present invention, a resonator system is provided. The resonator system includes a support structure and an array of resonators disposed on the support structure. The resonators include a low-Q resonator and at least one high-Q resonator having a Q higher than the Q of the low-Q resonator. The array of resonators are coupled together to form a composite resonator on the support structure having an effective Q greater than the Q of the low-Q resonator.

The low-Q resonator may have a motional impedance and the composite resonator may have an effective motional impedance substantially equal to the motional impedance of the low-Q resonator.

The above object and other objects, features, and advantages of the present invention are readily apparent from the following detailed description of the best mode for carrying out the invention when taken in connection with the accompanying drawings.

DETAILED DESCRIPTION OF THE PREFERRED EMBODIMENTS

Wine-Glass Disk Array

This application presents a way to achieve high-Q and low motional impedance via a mechanical circuit-based approach that boosts the Q of a vibrating micromechanical resonator by embedding it into a mechanically-coupled array [3] of much higher Q resonators to raise its functional Q by a factor approximately equal to the number of resonators in the array. As an example, using this method, the low Q of 7,506 exhibited by a support-loss-limited 60-MHZ wineglass disk resonator by itself was effectively raised by about 9× to 63,207 when embedded into a mechanically-coupled array of eight very high-Q wine-glass disks that then form a composite resonator. In addition to boosting Q, the methods of this application also stand to enhance the manufacturing repeatability of micromechanical resonator-based products, since they present a convenient method for ensuring Q's greater than a specified threshold value, even when some resonator's Q's are lower than it.

Figure 1A:
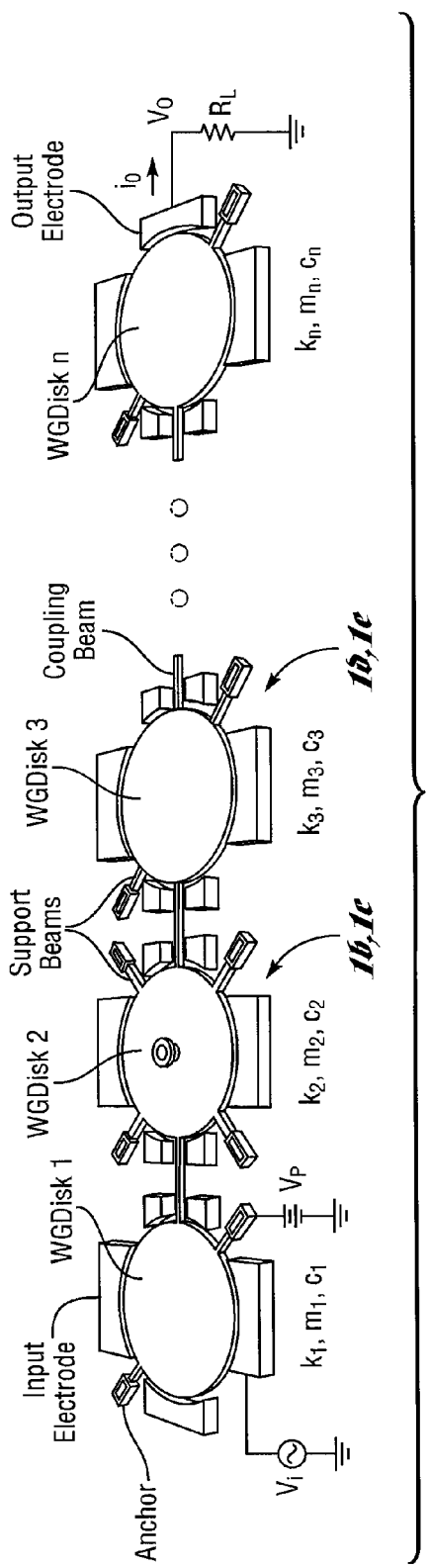
FIG. 1a is a perspective schematic view of an n-resonator version of the mechanically-coupled wine-glass disk resonator array structure, where $k_i$, $m_i$, and $c_i$ (i=1, 2, ..., n) are the stiffness, mass, and damping of each resonator, respectively; the SEM's and measured frequency characteristics of the low-Q and high-Q resonators are shown in FIGS. 1b and 1c and FIGS. 1d and 1e, respectively.

FIG. 1(a) presents the schematic of an n-resonator version of the mechanically-coupled array structure used to boost Q, together with a typical two-port bias and excitation scheme. Here, n disks, each designed to resonate at 60 MHZ in the compound-(2,1) (or "wineglass") mode shape of FIG. 2, are coupled mechanically [1] by 1 μm-wide, half-wavelength coupling beams connecting each adjacent resonator to one another at high-velocity locations.

Figure 2:
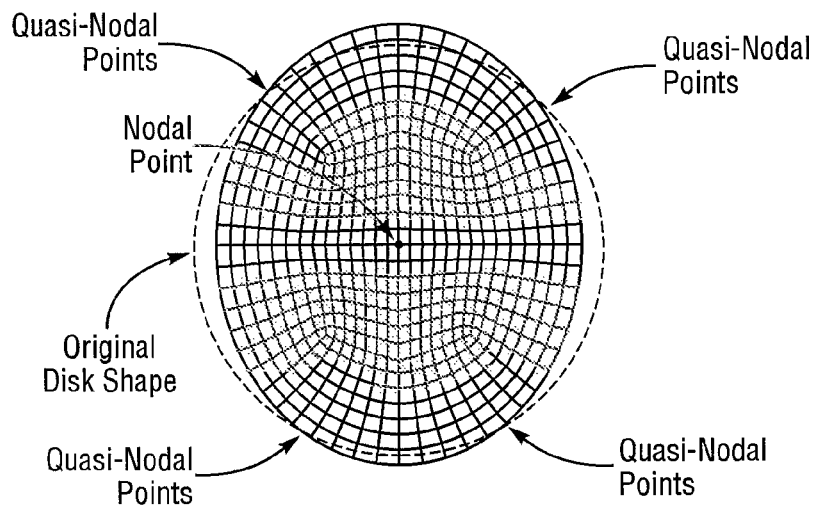
FIG. 2 shows a wine-glass mode shape simulated via finite element analysis (using ANSYS)

Each resonator in the array consists of a 32 μm-radius, 3 μm-thick, electrically conductive disk suspended above the substrate by beams that attach to the disk at quasi-nodal points [5], where displacements are negligible compared to other parts of the disk structure when the disk vibrates in the wine-glass mode shape of FIG. 2, where the disk expands along one axis and contracts in the orthogonal axis. Electrodes surround the disk with a lateral electrode-to-disk gap spacing of only 80 nm. To operate this device, a dc-bias $V_P$ is applied to the disk structure, and an ac voltage $v_i$ is applied to the input electrodes. There is no dc current flowing once the conductive structure is charged to $V_P$, so there is no dc power consumption. This $V_P v_i$ voltage combination generates a time-varying force that drives the disk into the wine-glass mode shape when the frequency of $v_i$ matches the wine-glass resonance frequency $_{of}$, which is inversely proportional to the disk radius. ([5] provides a complete formulation for $_{of}$.)

Figure 1C:
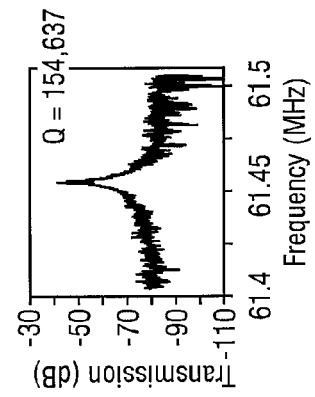
Figure 1B:
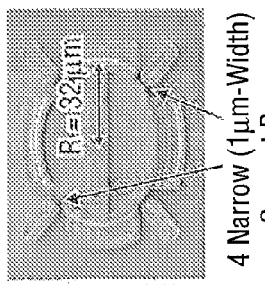
Figure 1C:
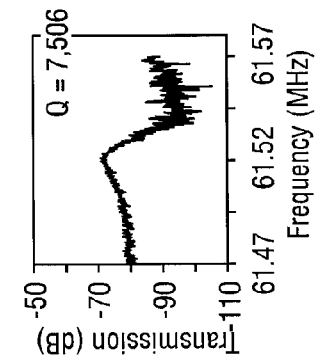
Figure 1B:
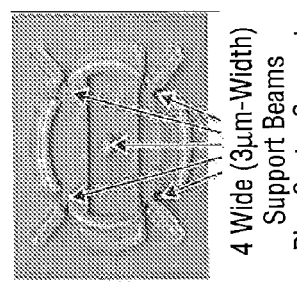

As shown in [5], the Q of a wine-glass disk resonator is strongly dependent on its supports, where the highest Q's are attained when using the fewest and thinnest supports, such as in FIG. 1(d), and where low Q's can be obtained by increasing the support count and size, such as in FIG. 1(b). Table 1 emphasizes this point with measured Q values for various support number and size combinations.

TABLE 1

Measured Quality Factor Performance

Single Wine-Glass Disk Resonator
Support Beam Parameters

| Support Beam Number | Support Beam Width | Measured Quality Factor |
|---|---|---|
| 2 | 1 μm | 154,637 |
| 3 | 1 μm | 133,130 |
| 4 | 1 μm | 121,345 |
| 4 | 1.5 μm | 55,750 |
| 4 | 2 μm | 21,007 |
| 4 | 3 μm | 8,989 |
| 4 + Center | 3 μm | 7,506 |

As shown, the Q drops from 154,637 to 121,345 as the number of support beams increases from 2 to 4. In addition, Q drops from 121,345 to 8,989 as support beam width increases from 1 μm to 3 μm. Thus, disk 2 in the FIG. 1(a) array, with 4 wide support beams and a stem, if operated all by itself, would exhibit a considerably lower Q than the adjacent resonators that have only two thin supports each, as verified by the measurements of FIG. 1(c) and FIG. 1(e).

However, when embedded in the array of FIG. 1(a), the damping factor $c_{array}$ of the total array becomes equal to the sum of the damping factors $C_n$'s of all the resonators. Assuming that the stiffnesses $(k_n)$ and masses $(m_n)$ of all disks are the same and equal to $k_r$ and $m_r$, respectively, and recognizing that Q is related to damping factor by $$c_n = \frac{\sqrt{k_n \cdot m_n}}{Q_n} \quad (1)$$

then $$c_{array} = c_1 + c_2 + \ldots + c_n \quad (2)$$
$$k_{array} = k_1 + k_2 + \ldots + k_n = n \cdot k_r$$
$$m_{array} = m_1 + m_2 + \ldots + m_n = n \cdot m_r$$

can be rearranged to yield an expression for the Q of the whole array:

$$Q_{array} = n \cdot \left( \frac{1}{Q_1} + \frac{1}{Q_2} + \ldots + \frac{1}{Q_n} \right)^{-1} \quad (3)$$

For the case where the Q of one of the resonators, say $Q_2$, is much less than the Q's of all other resonators, (3) reduces to $$Q_{array} \approx n \cdot Q_2 \quad (4)$$

In effect, for this case, the array takes on a functional Q that is about n times larger than $Q_2$. Using a similar derivation procedure, the motional resistance of the input/output resonator 2 can be expressed as:

$$R_{x2array} = R_{x2} \cdot \frac{Q_2}{(Q_1 \| Q_2 \| \ldots \| Q_n)}$$

Piezo-Q-Boosting

One of the major applications of this Q-boosting method will very likely be to increase the Q's of piezoelectric resonators while maintaining their low impedance. In particular, piezoelectric resonators often possess stronger electromechanical coupling than capacitive resonators, allowing them to more easily achieve impedances below 50Ω. They, however, have much worse Q's than capacitively driven resonators, with common Q values in the range of 100's to 1,000's, to be compared with the >10,000 (and often >100,000) of capacitive resonators. The Q-boosting strategy described here allows us to break this Q versus impedance trade-off, and actually attain a composite resonator with simultaneous high Q and low motional impedance.

Figure 6:
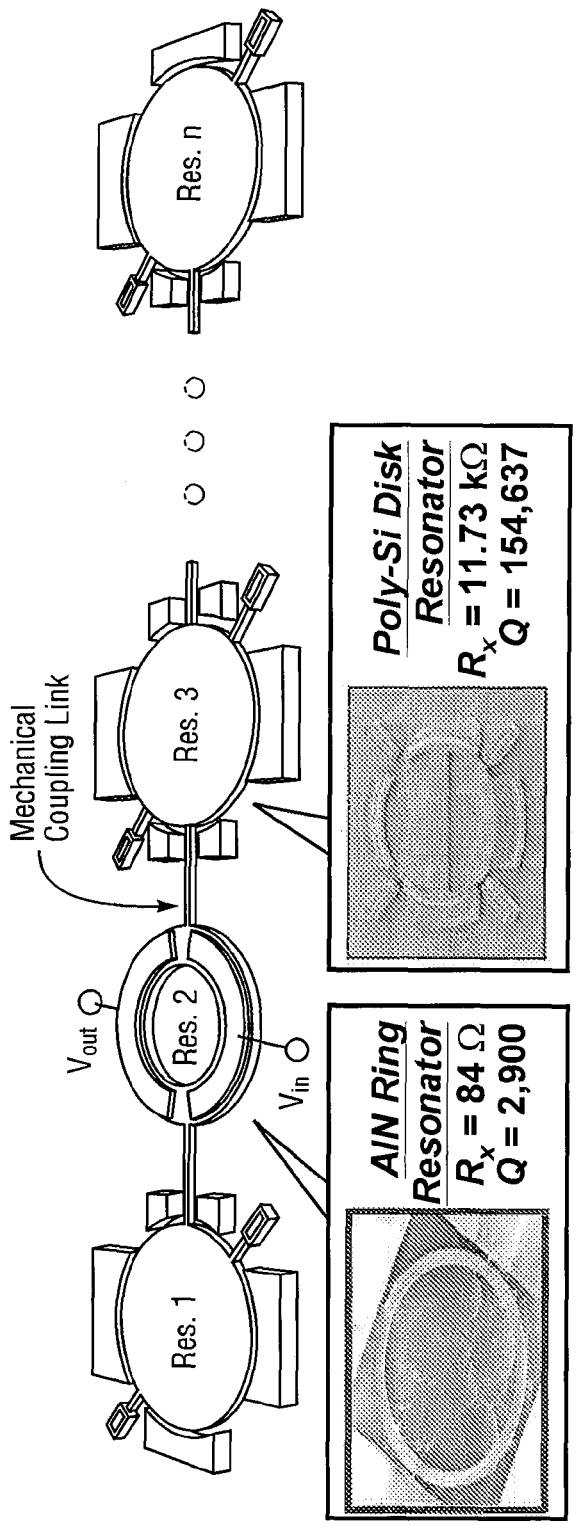
FIG. 6 is a schematic view illustrating the topology and analytical model for Q-boosting of a low impedance (but low Q) piezoelectric I/O ring resonator via mechanical coupling with much higher Q polysilicon wine-glass disk resonators.

FIG. 6 depicts one possible embodiment for doing this. Here, a piezoelectric ring resonator such as realized in [7] is mechanically coupled via coupling beams to several (much higher Q) polysilicon resonators on both sides of it, ultimately realizing an array of n mechanically coupled resonators. Although the figure shows electrodes for the polysilicon resonators, these electrodes are actually not needed for Q-boosting to work. In other words, the polysilicon resonators can be electrode-less, if desired, in which case they would serve only to raise the Q of the total system, and particularly, of the piezoelectric resonator (i.e., resonator 2). Using the expressions shown in FIG. 6, the Q of the piezoelectric resonator goes from 2,900 to 15,906 for the case where n=6, and all this with very little compromise in its motional impedance, which goes from 84Ω to 92Ω. In this embodiment, the piezoelectric resonator might be an AlN resonator using a metal electrode, as shown; or it might be a polysilicon (or silicon) resonator with piezoelectric material and metal electrode on top of it. Either rendition will work.

Figure 7:
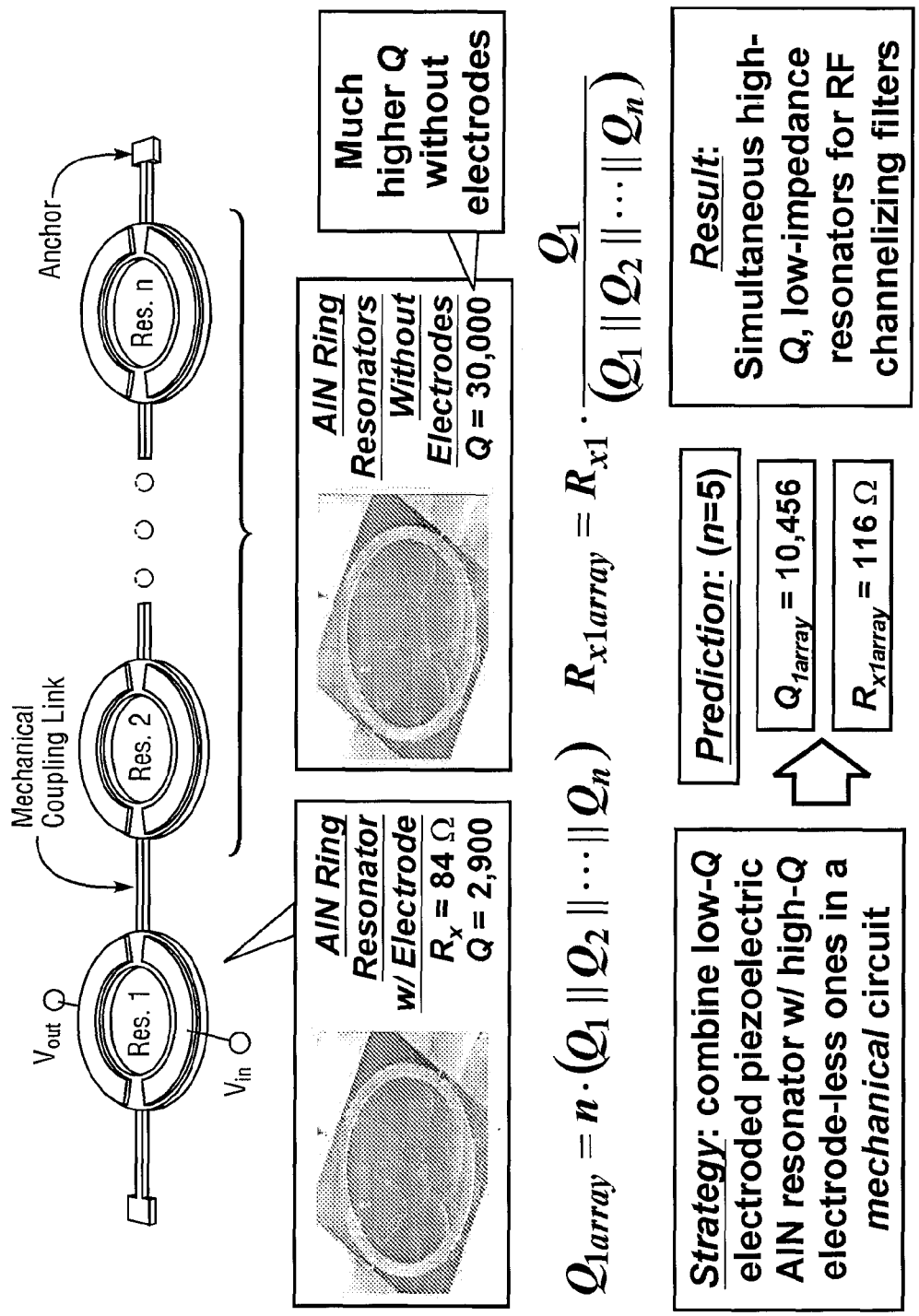
FIG. 7 is a schematic view illustrating the topology and analytical model for Q-boosting of a low impedance (but low Q) piezoelectric I/O ring resonator via mechanical coupling with much higher Q piezoelectric resonators without electrodes.

FIG. 7 depicts yet another possible rendition of Q-boosting for piezoelectric resonators, this time utilizing all piezoelectric resonators; i.e., no polysilicon. This strategy relies on the assumption that it is the metal electrode (and the ensuing metal-to-AlN interface) that dominates losses in an AlN piezoelectric resonator, meaning that the Q of AlN can be high for the material alone, when there is no contacting metal electrode. As such, the topology of FIG. 7 utilizes a conventional "electroded" AlN ring resonator mechanically coupled to (n−1) electrode-less AlN ring resonators. Here, the electrode-less AlN ring resonators should have higher Q, simply because they are not in contact with metal electrodes. If the electrode-less AlN resonators have a Q of 30,000, then for n=5 the equations shown in the figure predict that the Q of the electroded resonator (i.e., resonator 1) should go from 2,900 to 10,456, while its motional resistance goes up by only a modest amount, from 84Ω to 116Ω.

Q-Boosting of Non-Identical Resonators

Thus far, we have focused mainly on Q-boosting arrays where all resonators in the array are nearly identical, i.e., they have similar masses and stiffnesses. This, however, is by no means required. In fact, more effective Q-boosting can actually be attained by coupling a resonator that has a larger mass and stiffness than the resonator to be Q-boosted. (Even the frequencies of the resonators need not be the same.) In particular, when a first resonator (resonator 1) with mass $m_1$ and stiffness $k_1$, is coupled to another resonator (resonator 2) with much larger mass $m_2=n \times m_1$ and stiffness $k_2=n \times k_2$, and if the Q of resonator 2 is much larger (e.g., 10× larger), then use of the previous methodologies where the total resonator system stiffness and mass take on values equal to the sum of the individual resonator values, yields for the Q and motional resistance $R_x$, respectively, of resonator 1

$$Q_{1array} \approx (n+1) \cdot Q_1 \quad (5)$$

$$R_{x1array} \approx R_{x1} \quad (6)$$

Figure 8:
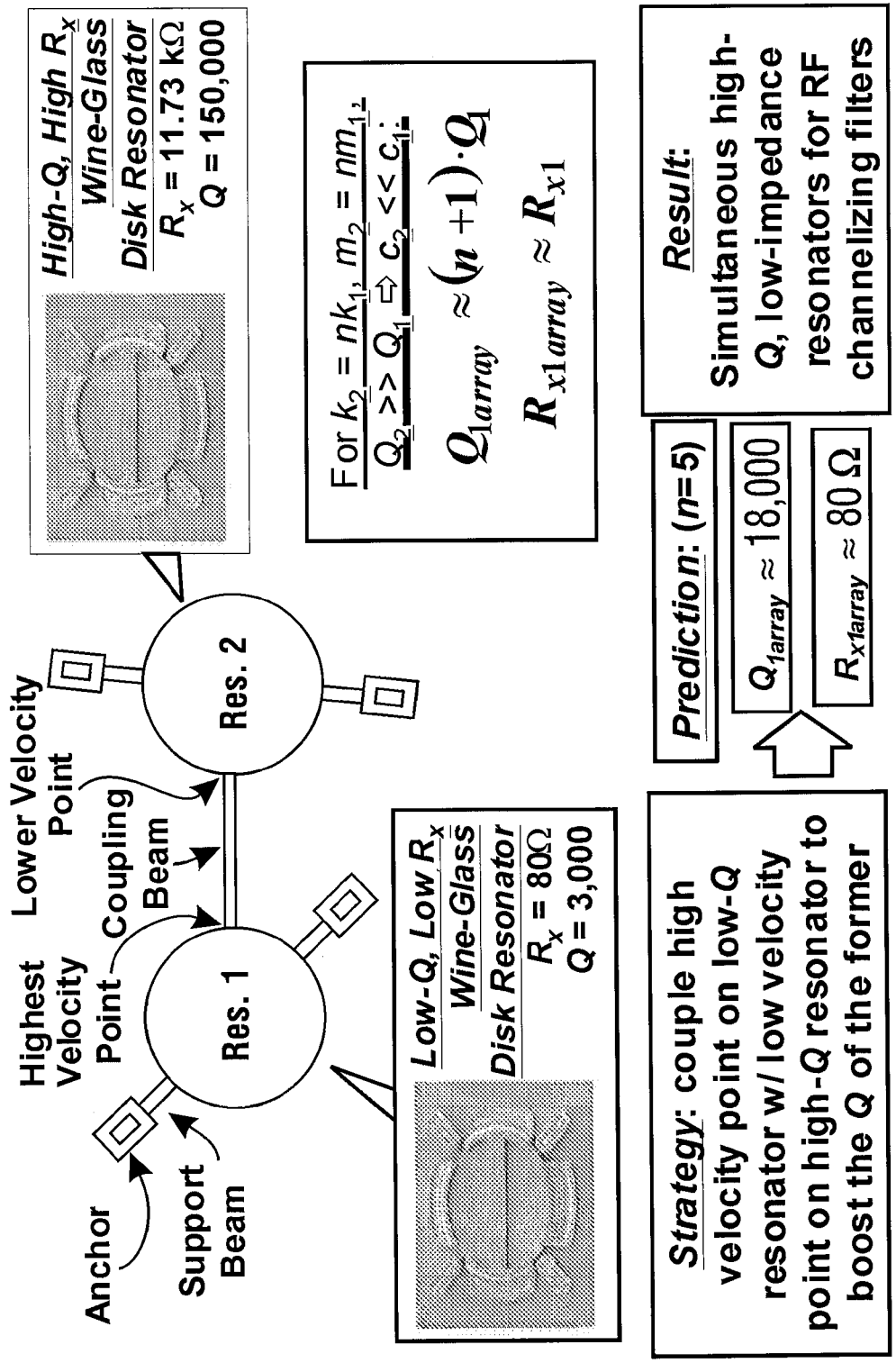
FIG. 8 is a schematic view illustrating the topology and analytical model for Q-boosting of a low impedance (but low Q) wine-glass disk resonator via mechanical coupling a high velocity point on its edge with a much lower velocity point of a higher Q polysilicon wine-glass disk; rotation of the axis of resonator 2 versus that of resonator 1 to achieve a higher velocity coupling point in the former.
Figure 9:
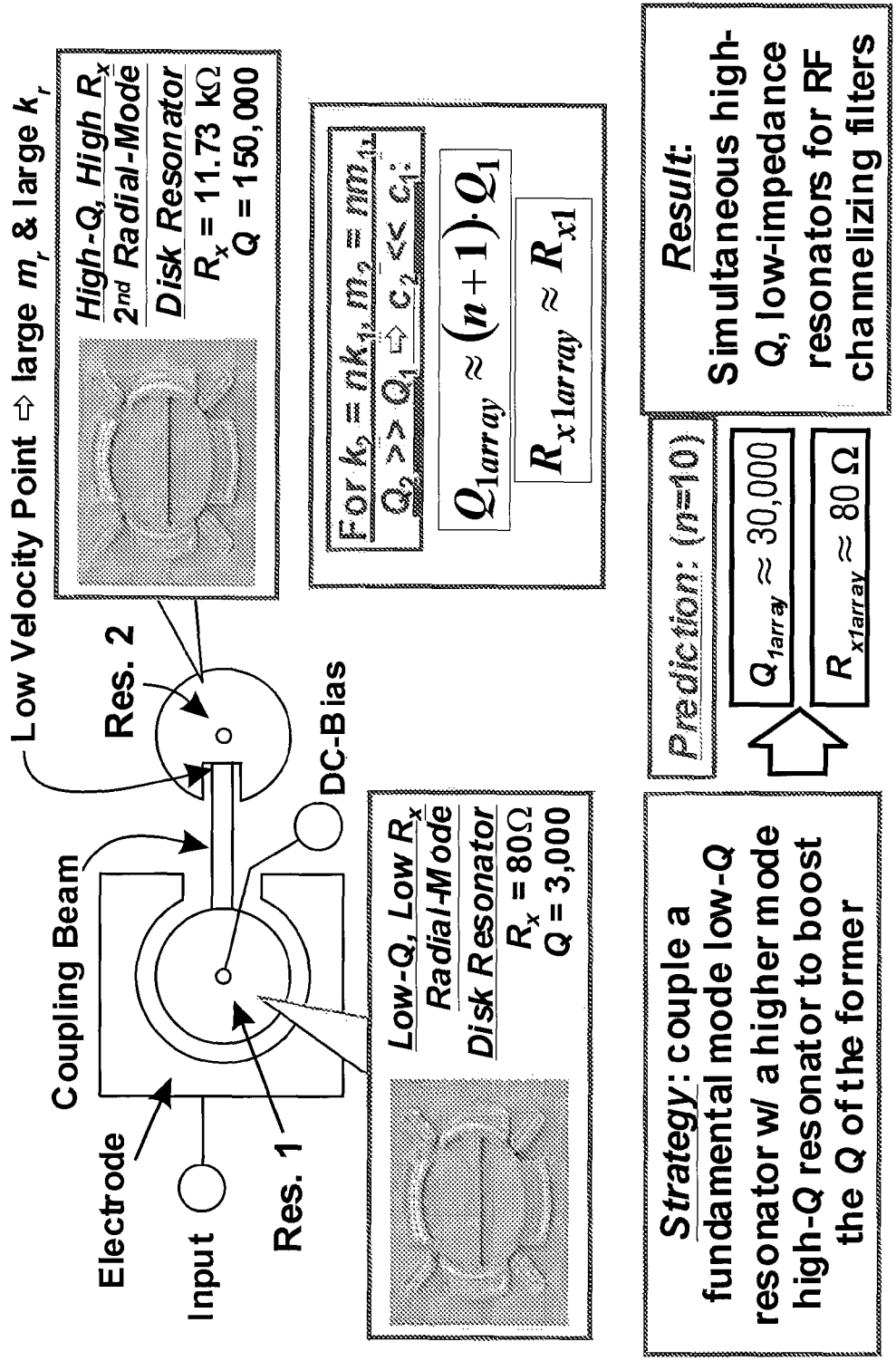
FIG. 9 is a schematic view illustrating the topology and analytical model for Q-boosting of a low impedance (but low Q) radial-mode disk resonator via mechanical coupling a high velocity point on its edge with a much lower velocity point of a notched higher Q polysilicon radial-mode disk; coupling to a notched point much deeper within the disk of resonator 2 versus that of resonator 1 achieves a higher velocity coupling point in the former, as described in [9] [10]
Figure 10:
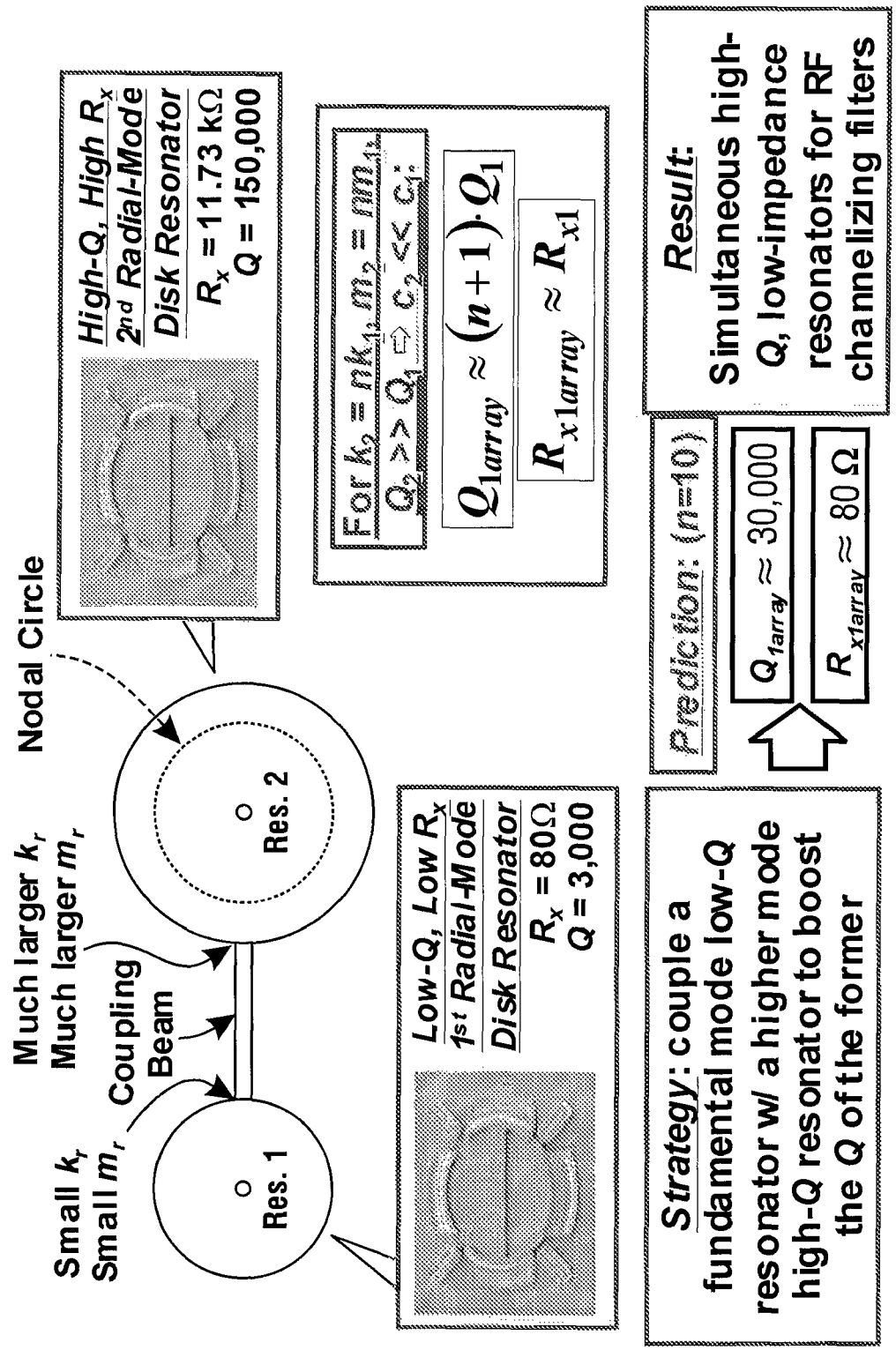
FIG. 10 is a schematic view illustrating the topology and analytical model for Q-boosting of a low impedance (but low Q) radial-mode disk resonator via mechanical coupling to a second disk that resonates at the fundamental resonance frequency of resonator 1 when in its $2^{nd}$ radial mode; here, because it operates in a second mode to achieve the same frequency, the stiffness and mass at the coupling point on the edge of resonator 2 is much higher than that at the edge of the fundamental mode resonator 1; thus, the Q-boosting ratio can be quite high in this embodiment.

FIG. 8 through FIG. 10 illustrate several embodiments of this concept.

Q-Boosting Via Low Velocity Coupling

FIG. 8 and FIG. 9 depict methods for Q-boosting via low velocity coupling. As explained in [8], the lower the velocity at a given point on any mechanical resonator, the higher the mass and stiffness at that point. Thus, a low velocity point has a much higher mass and stiffness than a higher velocity point. Because stiffness and mass add when two resonators are coupled, the higher mass and stiffness afforded when a Q-boosting resonator is coupled make it a much more effective Q-booster. To illustrate, FIG. 8 shows one embodiment of Q-boosting, where a wine-glass disk resonator is coupled from its highest velocity point by a coupling beam attached to a lower velocity point of a second (in this case identical, except for a much higher Q) wine-glass disk resonator. Here, the mass and stiffness at the highest velocity point of resonator 1, where the coupling beam attaches, might be n times smaller than that at the lower velocity point where the coupling beam attaches to resonator 2. For the case of FIG. 8, where the Q of resonator 2 is much larger than that of resonator 1, and where n=5, the expressions in the figure dictate that the Q of resonator 1 is boosted from 3,000 to 18,000; while its motional impedance stays relatively the same, at around 80Ω.

In the embodiment of FIG. 9, radial-mode resonators are utilized, where access to a low velocity point on the Q-boosting resonator (resonator 2) is afforded by notching, as described in [9] and [10]. Other than this, the concept of Q-boosting via low velocity coupling is similar to that of the example of FIG. 8.

Q-Boosting Via Mode Coupling

FIG. 10 shows yet another embodiment of Q-boosting using resonators with differing mass and stiffness. Here, radial-mode resonators are utilized, where resonator 2 is designed to resonate at a frequency equal to that of resonator 1 (which is assumed to have lower Q) when the former vibrates in its second mode. In this case, the second mode stiffness at the coupling location of resonator 2 can be 10× (or more) higher than that of resonator 1. Again, using the same governing equations (5) and (6), the boosted Q of resonator 1 becomes 30,000, while its motional resistance remains about the same, at 80Ω.

More General Embodiments

Of course, there are virtually infinitely many different embodiments of Q-boosting beyond those discussed as examples in this document. For example, stiffness and mass can be increased by making a resonator thicker, or by using entirely different types of resonators (e.g., squares versus disks).

At least one embodiment of the invention involves a method for sharing energy between a very high-Q resonator and a lower Q one via coupling, where the word "coupling" can be very general, i.e., it can be mechanical coupling, but also other types of coupling (e.g., electrostatic, magnetic, etc.) The method applies not only to electrostatic vibrating resonators, but to any resonator type, be it electrostatic, piezoelectric, purely electrical LC, ocean waves, etc. It is a method for raising the Q of any resonator while maintaining its impedance, and as such, can find use in any resonator application, which includes virtually all electronics. The method entails an energy-sharing between resonators that allows boosting of the Q of the lower Q resonator. Also, there may be applications for lowering the Q of a resonator which has too high a Q.

Also, broadly speaking, at least one embodiment of the invention involves a method for adding effective mass m and stiffness k to a resonator without significantly altering its damping c, so as to effect an increase in its Q via the expression:

$$Q = \frac{\sqrt{km}}{c}$$

Experimental Results Based on One Embodiment of the Invention

Figure 3A:
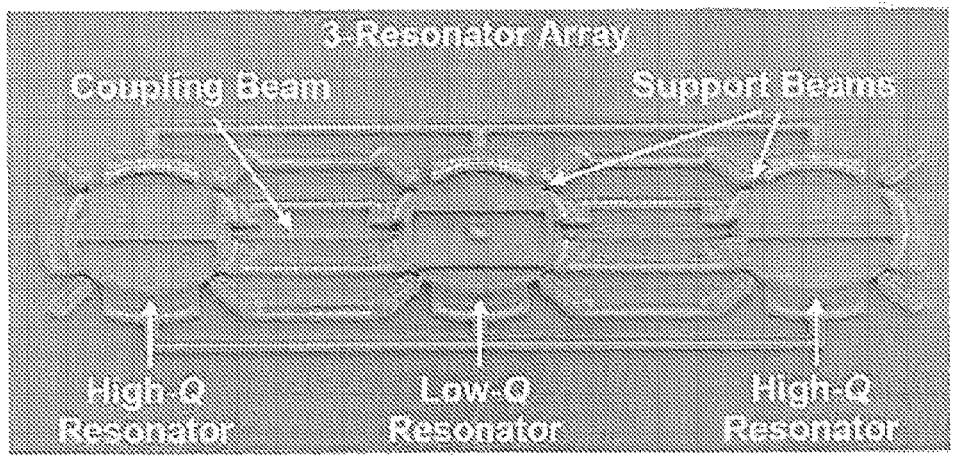
FIGS. 3a and 3b are SEM's of fabricated 60-MHZ wine-glass disk resonator arrays with different combinations of high-Q and low-Q resonators.
Figure 3B:
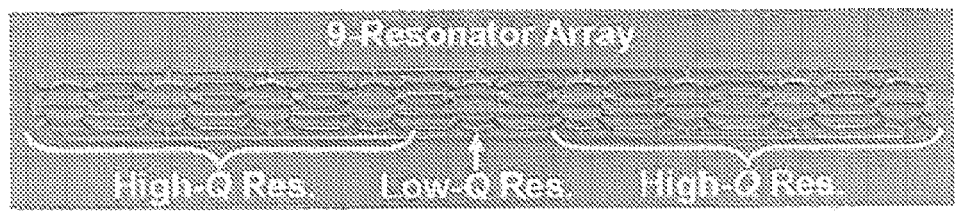

Wine glass disk array resonators were fabricated via a three-polysilicon self-aligned stem process used previously to achieve disk resonators [6]. FIG. 1(b) and FIG. 1(d) already presented SEM's of fabricated low-Q and high-Q 60-MHZ wine-glass disks, while FIGS. 3a and 3b presents SEM's of fabricated 60-MHZ wine-glass disk arrays, one comprised of 1 low-Q and 2 high-Q resonators (c.f., FIG. 3(a)), and the other of 1 low-Q and 8 high-Q resonators (c.f., FIG. 3(b)). Testing was done under vacuum to preserve the anchor-defined differences in the Q's of the micromechanical resonators. In addition, dc bias voltages of $V_P=5$ V and input powers of −30 dBm from the port of the network analyzer were utilized.

Figure 4:
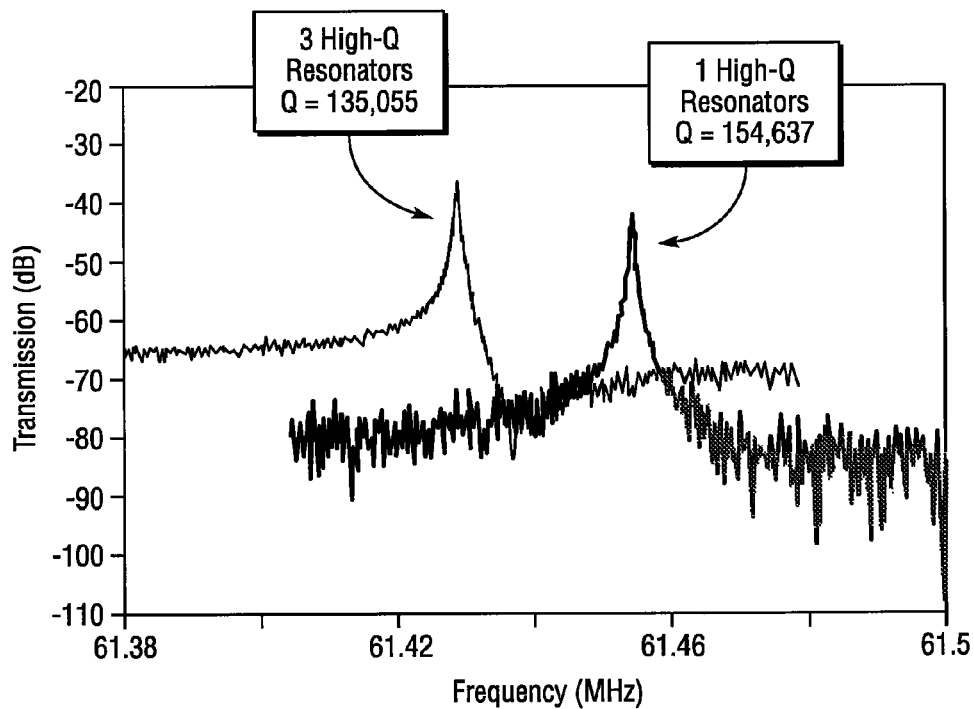
FIG. 4 is a graph of measured frequency characteristics for a high-Q wine-glass resonator and a mechanically-coupled array of three such resonators.

FIG. 4 combines the measured frequency characteristics for the stand-alone high-Q wine-glass disk of FIG. 1(b) and a three-resonator array of this resonator type. Here, the 135,055 Q of the array is not far from the 154,637 of a single resonator, verifying the prediction of (3).

Figure 5:
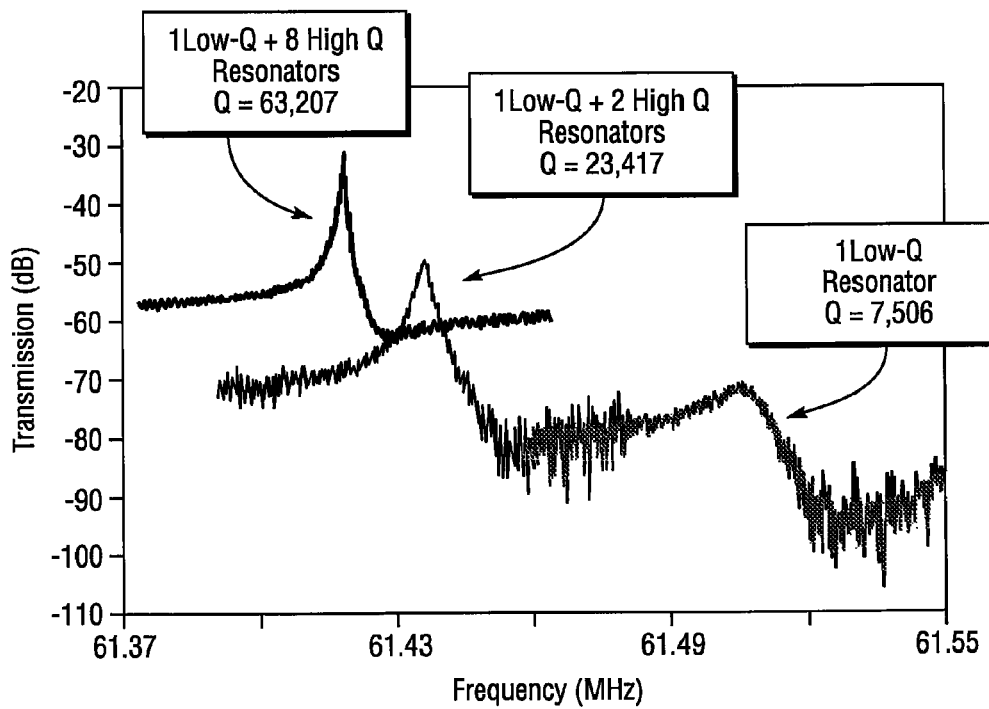
FIG. 5 is a graph of measured frequency characteristics for wine-glass disk resonators and arrays with one low-Q resonator and several high-Q resonators, showing that mechanically-coupled arrays can "fix" the Q of a bad resonator.

FIG. 5 combines the measured frequency characteristics of the stand-alone low-Q resonator of FIG. 1(b) with those of the arrays in FIGS. 3a and 3b. Here, whereas the low-Q resonator exhibits a Q of only 7,506 by itself, its functional Q rises to 23,417 when mechanically-coupled to 2 high-Q resonators in the three-resonator array, which is close to the Q=22,518 predicted by (4). When this low-Q resonator is mechanically-coupled with 8 high-Q resonators, the Q of the resulting 9-resonator array is boosted even more dramatically to 63,207, which is about 9× larger than the Q~7,506 of the embedded low-Q disk, and is again consistent with the prediction of (4).

Conclusions Based on One Embodiment of the Invention

A micromechanical circuit technique based on mechanically-coupled arraying has been demonstrated to boost the Q's of vibrating micromechanical resonators by factors as high as 9 times. When used to raise the Q's of low-Q resonators, this Q-boosting method can enhance the manufacturing repeatability of micromechanical resonator-based products, since they present a convenient method for ensuring Q's greater than a specified threshold value, even when some of the resonator's Q's are lower than it.

A perhaps more ground-breaking benefit of the described Q boosting is the potential for achieving micromechanical circuits or systems that simultaneously exhibit high-Q and low impedance—a highly desirable combination that so far has not been achieved by stand-alone MEMS resonator designs. If, for example, the ring-shaped aluminum nitride piezoelectric micromechanical resonator of [4] with Q=2,900 and motional resistance~84 Ω at 472.7 MHZ were combined in a mechanically-coupled array with 8 high-Q polysilicon resonators, such as those shown in FIG. 1(d), perhaps with Q's~50,000 at this frequency, the resulting array-composite resonator would be expected to exhibit a Q~26,100 (according to (4)), with a motional resistance a bit higher than the original 84Ω at 472.7 MHZ (due to higher mass and stiffness [3]), but still relatively small.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of making a resonator system, the method comprising:
   providing a substrate;
   providing an array of resonators on the substrate, the array of resonators including a first resonator having a Q and at least one resonator having a Q different than the Q of the first resonator; and
   coupling the array of resonators together to form a composite resonator on the substrate having an effective Q different than the Q of the first resonator wherein the effective Q is greater than the Q of the first resonator by a factor approximately equal to the number of resonators in the array.

2. A method of making a resonator system, the method comprising:
   providing a substrate;
   providing an array of resonators on the substrate, the array of resonators including a first resonator having a Q and at least one resonator having a Q different than the Q of the first resonator; and
   coupling the array of resonators together to form a composite resonator on the substrate having an effective Q different than the Q of the first resonator wherein the first resonator has a relatively low motional impedance and wherein the composite resonator has an effective motional impedance substantially equal to the low motional impedance.

3. The method as claimed in claim 2, wherein the step of coupling is performed mechanically.

4. The method as claimed in claim 2, wherein the first resonator is a high-Q resonator and the at least one resonator is at least one low-Q resonator having a Q lower than a Q of the high-Q resonator and wherein the effective Q is less than the Q of the high-Q resonator.

5. The method as claimed in claim 2, wherein the system is a microresonator system and wherein each of the resonators is a micromechanical resonator.

6. The method as claimed in claim 2, wherein the first resonator is a low-Q resonator and the at least one resonator is at least one high-Q resonator having a Q greater than a Q of the low-Q resonator and wherein the effective Q is greater than the Q of the low-Q resonator.

7. A resonator system comprising:
   a substrate; and
   an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the low-Q resonator comprises a piezoelectric resonator having a relatively low motional impedance.

8. A resonator system comprising:
   a substrate; and
   an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the at least one high-Q resonator is operable in a wine-glass mode.

9. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the low-Q resonator has a relatively low motional impedance and wherein the composite resonator has an effective motional impedance substantially equal to the low motional impedance.

10. The system as claimed in claim 9, wherein the array of resonators are mechanically coupled together.

11. The system as claimed in claim 10 further comprising at least one coupling beam for mechanically coupling adjacent resonators in the array together.

12. The system as claimed in claim 9, wherein each of the resonators is a mechanical resonator.

13. The system as claimed in claim 12, wherein each of the resonators is a micromechanical resonator.

14. The system as claimed in claim 9, wherein the at least one high-Q resonator is a disk resonator.

15. The system as claimed in claim 9 further comprising a support structure for supporting each of the resonators in the array above the substrate and wherein the Q of each of the resonators in the array is based on its respective support structure.

16. The system as claimed in claim 9, wherein the at least one high-Q resonator is a capacitively-transduced resonator.

17. The system as claimed in claim 9, wherein all the resonators in the array are capacitively or piezoelectrically-transduced resonators.

18. The system as claimed in claim 9, wherein all of the resonators in the array comprise disk resonators.

19. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein all of the resonators in the array are operable in a wine-glass mode.

20. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the low-Q resonator includes an electrode and wherein the at least one high-Q resonator does not have any electrodes.

21. A resonator system comprising:
a substrate;
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the array of resonators are mechanically coupled together; and
at least one coupling beam for mechanically coupling adjacent resonators in the array together wherein the low-Q resonator has a relatively high velocity point and wherein the at least one high-Q resonator has a relatively low velocity point and wherein the at least one coupling beam is mechanically coupled to the at least one high-Q resonator and the low-Q resonator at the low and high velocity points, respectively.

22. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the low-Q resonator is operable in a fundamental mode and the at least one high-Q resonator is operable in a mode higher than the fundamental mode.

23. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein all of the resonators in the array have substantially the same mass and the same stiffness.

24. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein the low-Q resonator has a lower mass and a lower stiffness than the mass and the stiffness, respectively, of the at least one high-Q resonator.

25. A resonator system comprising:
a substrate; and
an array of resonators disposed on the substrate, the array of resonators including a low-Q resonator and at least one high-Q resonator having a Q higher than a Q of the low-Q resonator, wherein the array of resonators are coupled together to form a composite resonator on the substrate having an effective Q greater than the Q of the low-Q resonator wherein all of the resonators in the array are operable in a radial mode.

26. A resonator system comprising:
a support structure; and
an array of resonators disposed on the support structure, the array of resonators including a low-Q resonator and at least one high-Q resonator having a Q higher than the Q of the low-Q resonator wherein the array of resonators are coupled together to form a composite resonator on the support structure having an effective Q greater than the Q of the low-Q resonator wherein the low-Q resonator has a motional impedance and wherein the composite resonator has an effective motional impedance substantially equal to the motional impedance of the low-Q resonator.

* * * * *